United States Patent [19]

Avery

[11] Patent Number: 5,043,782
[45] Date of Patent: Aug. 27, 1991

[54] LOW VOLTAGE TRIGGERED SNAP-BACK DEVICE

[75] Inventor: Leslie R. Avery, Flemington, N.J.

[73] Assignee: David Sarnoff Research Center, Inc., Princeton, N.J.

[21] Appl. No.: 517,891

[22] Filed: May 8, 1990

[51] Int. Cl.⁵ ......................................... H01L 27/088
[52] U.S. Cl. .................................. 357/23.13; 357/35; 361/91
[58] Field of Search .................. 357/23.13, 13, 35, 36; 361/91

[56] References Cited

U.S. PATENT DOCUMENTS

| | | | |
|---|---|---|---|
| 3,787,717 | 1/1974 | Fischer et al. | 357/23.13 |
| 4,484,206 | 11/1984 | Moroshima et al. | 357/13 |
| 4,605,980 | 8/1986 | Hartranft et al. | 361/56 |
| 4,656,491 | 4/1987 | Igarashi | 357/23.13 |
| 4,692,781 | 9/1987 | Rountree et al. | 357/23.13 |
| 4,739,438 | 4/1988 | Sato | 357/23.13 |
| 4,745,450 | 5/1988 | Hartranft et al. | 357/23.13 |
| 4,786,956 | 11/1988 | Puar | 357/23.13 |
| 4,821,096 | 4/1989 | Maloney | 357/23.13 |
| 4,855,620 | 8/1989 | Duvvury et al. | 307/448 |
| 4,868,621 | 9/1989 | Miyamoto | 357/23.13 |

FOREIGN PATENT DOCUMENTS 61-292351 12/1986 Japan ........................ 357/23.13

Primary Examiner—William D. Larkins
Attorney, Agent, or Firm—William J. Burke

[57] ABSTRACT

A protection device for an integrated circuit includes short and longer channel length structures, each of which provides a parasitic bipolar transistor, connected between a terminal of the integrated circuit and a source of reference voltage. The short channel length structure has a breakdown voltage greater than the supply voltage for the integrated circuit, and less than the insulator damage threshold of the integrated circuit. The conduction through the short channel length structure after initiation of a transient phenomena causes the longer channel length structure to conduct before the transient exceeds the breakdown voltage of the integrated circuit and the short channel length structure. The longer channel length structure operatges in the "snap-back" conduction mode when the current density exceeds a critical value to conduct away the transient energy.

22 Claims, 4 Drawing Sheets

LOW VOLTAGE TRIGGERED SNAP-BACK DEVICE

FIELD OF THE INVENTION

The present invention relates generally to protection devices, and more particularly to protection devices for protecting integrated circuits from various electrical transients, including electrostatic discharge (ESD).

BACKGROUND OF THE INVENTION

Many attempts have been made in the prior art to protect semiconductor devices, including biopolar transistors, field effect devices, and integrated circuits against damage due to voltage and current transients. A particular problem with field effect devices has been their protection from electrostatic discharge (ESD).

Fischer, U.S. Pat. No. 3,787,717, teaches the use of a lateral bipolar transistor for protecting a field effect device. The lateral bipolar transistor includes a gated collector junction, and has its collector-to-emitter current path shunting the point in the circuit to be protected against overvoltage. Metallization is placed over a silicon dioxide passivation layer covering the collector junction, and electrically connected to the point in the substrate to be protected. Similarly the emitter electrode is connected to the point to be protected. When an over voltage occurs, the gated collector junction breaks down in an avalanche mode, allowing current to flow therefrom to the substrate, causing a potential drop in the base region of the lateral transistor, in turn causing the latter to conduct for shunting away excess current due to the overvoltage condition.

Hartranft et al., U.S. Pat. No. 4,605,980, teaches the use of a thick field effect transistor in combination with a thin field effect transistor to protect an integrated circuit, more specifically, to protect a field effect transistor from damage due to excessively high voltages and currents generated by electrostatic discharge. The protection circuit is formed on the same substrate and includes the a field effect transistor to be protected. A resistor-diode network is included in the circuitry for the thick field effect transistor. An elongated diffused resistor is included between an integrated circuit pad and the circuit to be protected. The thick field effect transistor is used to shunt high voltages and currents generated by electrostatic discharge away from the protected device, whereas the thin field effect transistor is used to protect against lower but still excessive voltages relative to the device being protected. There is no interaction between the thin and thick field effect transistors, other than each being employed for protecting a device over different ranges of voltage and current.

Rountree et al., U.S. Pat. No. 4,692,781, teaches an input protection circuit for a field effect transistor using a thick oxide transistor for providing the main protection to the device. The thick oxide field effect device serves to protect the integrated circuit against relatively high voltages. A thin gate field effect transistor is used to provide low voltage protection, and serves as a "field plate diode".

Hartranft et al., U.S. Pat. No. 4,745,450, teaches a circuit for protecting a thin gate oxide field effect transistor from puncture due to electrostatic discharge. The teachings of this invention are substantially similar to those of U.S. Pat. No. 4,605,980.

Puar, U.S. Pat. No. 4,786,956, discloses a device for protecting an integrated circuit from high input voltages, wherein the integrated circuit includes a semiconductor substrate with a recessed field-oxide region laterally separating active semiconductor portions. The protection device includes an N channel enhancement-mode field effect device having a source for receiving a first voltage, an insulated-gate electrode, and a drain electrode coupled to an input terminal, with the source and drain regions lying in one of the active portions along the upper surface of the substrate. A resistor is included for coupling the second voltage through the gate of the NMOS transistor. Another NMOS transistor, more specifically a thick-oxide device, has a source region lying in one of the active portions along the upper surface of the substrate coupled to the source of the first NMOS transistor, a gate electrode coupled to the input signal terminal, and a drain region lying in another of the active portions of the substrate along the upper surface thereof, that is also coupled to the input terminal.

Maloney, U.S. Pat. No. 4,821,096, discloses a device for protecting a semiconductor device from voltage and current surges, such as caused by electrostatic discharge. The protection device or circuit includes a first PNP lateral transistor having an emitter region coupled to an input terminal of the device, a base region also connected to the input terminal, and a collector region coupled to ground. Further included is a second PNP lateral transistor having an emitter region coupled through a resistor to the input terminal, and base and collector regions coupled to ground. The protection device serves to shunt high voltage surges and current spikes to ground, away from the device being protected. Another embodiment of the invention includes a pair of P⁻ type field effect transistors in a similar configuration, for protecting a semiconductor device.

Duvvury et al., U.S. Pat. No. 4,855,620, teaches the inclusion of a high threshold voltage field effect transistor for the active output transistor of a field effect transistor output buffer circuit. The high threshold voltage field effect device has its source-to-drain path connected between the power supply and the gate electrode of the output transistor. The high threshold voltage field effective device also has its gate connected to the output terminal of the output terminal. If an ESD transient occurs at the output terminal, the high threshold field effect device will conduct to protect the field effect transistor output buffer circuit, in that the former has a threshold voltage that is greater than the operating voltage of the output buffer, but less than the collector-base junction breakdown voltage to a parasitic bipolar transistor located in the output of the buffer circuit.

As very large scale integrated (VLSI) circuit geometries have continued to shrink, the decrease in the corresponding gate oxide thickness, relative to breakdown voltage, has been greater than the decrease in reverse junction breakdown of the typically available diffusions used to protect the oxide. At the one micrometer level, the difference in breakdown voltage is only a few volts. Also, the initial breakdown voltage of one of the commonly used structures, a thick oxide NMOS transistor snap-back device, is too high to provide protection for the related integrated circuit. Known protection circuits and devices are unable to meet the protection requirements for state-of-art VLSI devices.

SUMMARY OF THE INVENTION

The invention is a structure for protecting an integrated circuit which can be fabricated on the same substrate as the integrated circuit. The invention includes a short channel length structure and a relatively longer channel length structure in which the short channel length structure is triggered into the conductive state at a relatively lower voltage than the longer channel length structure, whereby the short channel length structure drives the longer channel length structure into a conductive state, thereby providing rapid turn-on of the protection device over a very wide range of voltage and current. The longer channel length structure serves to conduct away substantially all of the transient energy from a transient phenomena such as ESD, with the short channel length structure serving to turn on at a relatively low voltage level, during the initial risetime of the transient phenomena. This insures that the longer channel length structure is triggered on in time to protect the integrated circuit device from the transient energy.

BRIEF DESCRIPTION OF THE DRAWING

In the Drawing like items are identified by the same reference numeral and.

DETAILED DESCRIPTION OF THE INVENTION

Figure 1:
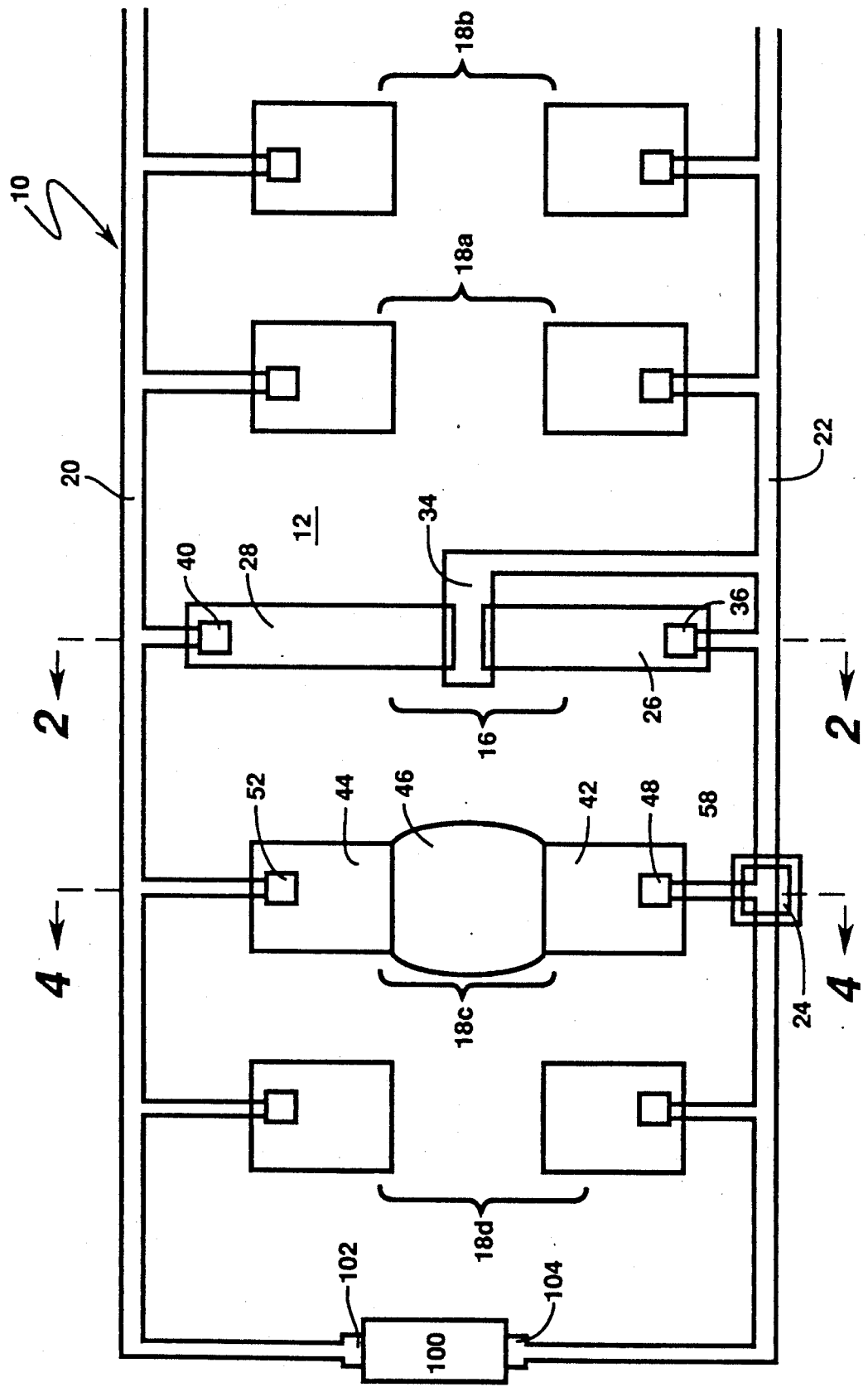
FIG. 1 is a schematic plan top view of the layout of the structure for one embodiment of invention.

An NMOS transistor incorporates a parasitic lateral bipolar NPN transistor. The parasitic lateral NPN transistor can be triggered into conduction when the collector-emitter breakdown voltage in the Vcer mode is exceeded. The P region (the substrate) of the NMOS transistor provides the base electrode of the parasitic lateral bipolar NPN transistor, which is normally connected to the associated emitter electrode (source of the NMOS transistor) a distance away from the actual base region. The substrate resistance forms an emitter-base shunt resistance. The NPN transistor may be fabricated without the NMOS gate electrode by using a thick field oxide to separate the two isolated N+ diffusions which form the collector and emitter regions. Typically, such as NPN transistor has a relatively wide base region, i.e. a relatively wide separation between collector and emitter regions. In order to reduce the initial breakdown voltage of the wide base region NPN transistor, it is necessary to use a narrower base region, i.e., use the parasitic NPN transistor of a short channel length NMOS transistor. However, such a device cannot absorb a large amount of energy without destruction of its associated gate insulator. The present inventor recognized that a structure which incorporates a short channel length structure to trigger a wide base region NPN transistor structure is required in protecting such devices. The short channel length structure has sufficient series resistance to prevent it from being damaged by transient voltages before the wide base region NPN transistor structure snaps back and conducts away the transient energy. It was further recognized that by providing a short channel length NMOS transistor preferably at the center, or near the center of, the protection device, for triggering a plurality of parasitic wide base region NPN transistor structures, within practical limits, enhanced protection from transient energy is provided for an associated integrated circuit.

In describing various embodiments of the invention, longer channel length structures comprise two relatively widely spaced regions of one conductivity type in a body of the opposite conductivity type, and short channel length structures are structures having narrowly spaced collector and emitter regions and breakdown voltages lower than those of the longer channel length structures.

In FIGS. 1 through 5, a structure 10 embodying the principles of the invention includes a semiconductor substrate 12, preferably of P− type conductivity, having a surface 14. The structure also includes a short channel length structure 16, a plurality of longer channel length structures 18a–18d, a bus 20, a reference line 22 connected to a source of reference potential, typically ground, and a substrate contact 24 between the substrate 12 and the reference line 22.

Also in FIG. 1 the use of the structure 10 with an integrated circuit 100 to be protected is illustrated. The integrated circuit 100 has an electrode 102 connected to the bus 20 and an electrode 104 connected to the reference line 22 so that the integrated circuit 100 is connected in parallel with the short channel length structure 16 and the plurality of longer channel length structures 18a–18d. The first terminal 102 of the integrated circuit 100 may be a voltage supply terminal or an input or output signal terminal and the second terminal 106 can be a source of reference potential, typically ground. The protection device 102 protects the integrated circuit 100 by turning on in response to transient voltages and conducting transient energy from the bus 20 to the reference line 22.

Figure 2:
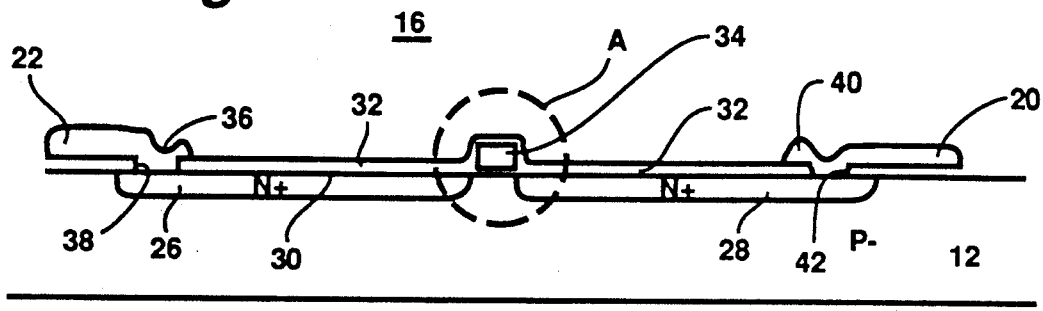
FIG. 2 is a cross section 2—2 of the structure of FIG. 1.
Figure 3:
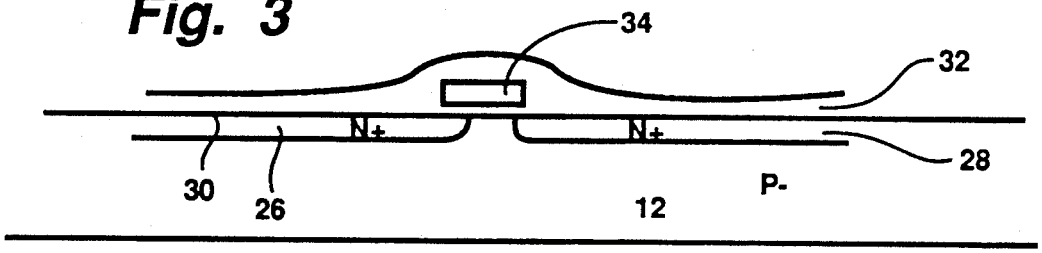
FIG. 3 is a cross-sectional enlargement of the area or region within "A" of FIG. 2.

The short channel length structure 16, as illustrated in FIGS. 1-3, comprises first and second N+ conductivity type regions 26 and 28, corresponding to the emitter and collector regions respectively, extending a distance into the substrate 12 from the surface 30 and spaced apart from one another. A thin insulator layer 32, preferably a silicon oxide layer, overlies the surface 30. A gate electrode 34 overlies the thin insulator layer 32 over the spacing between the first and second N+ conductivity type regions 26 and 28. The gate electrode 34 is not typically required for the operation of the device and is present primarily to serve as the mask for use in the self-aligned process for the formation of the first and second N+ conductivity type regions 26 and 28 with a short, well defined channel length therebetween. If the gate electrode 34 is present, it is electrically connected to the reference line 22. A first electrical contact 36 extends through an opening 38 in the thin insulator layer 32 to provide electrical contact to the first N+ conductivity type region 26. The first electrical contact 36 extends to the reference line 22. A second electrical contact 40 extends through an opening 42 in the thin insulator layer 32 to provide electrical contact to the second N+ conductivity type region 28. The second electrical contact 40 extends to the bus 20.

An enlargement of the region "A" in FIG. 2 is shown in FIG. 3. Using a fabrication process with 1.25 micrometer design rules, the gate 34 is typically about 1.25 micrometers wide, the spacing between the N+ regions 26 and 28 is typically about one micrometer and is preferably reduced to the minimum allowed by the process used.

Figure 4:
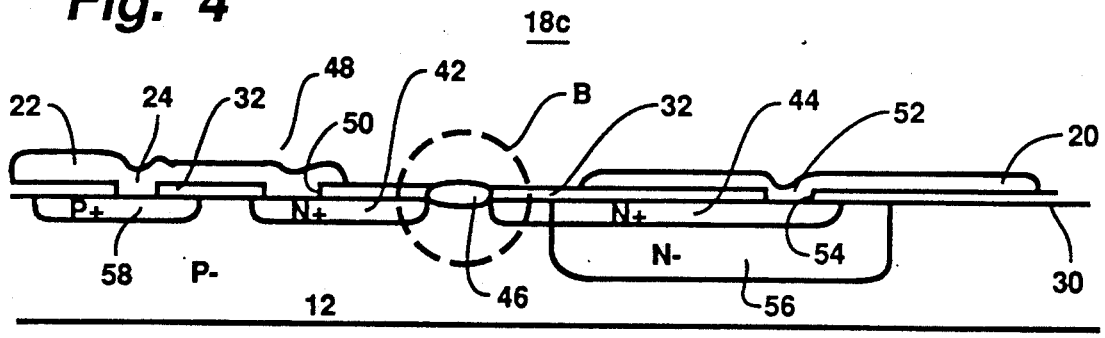
FIG. 4 is a cross section 4—4 of the structure of FIG. 1.
Figure 5:
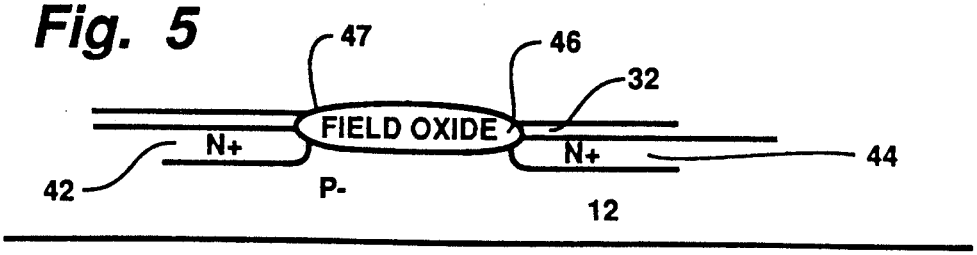
FIG. 5 is an enlarged cross section of the region or area "B" of FIG. 4.

In FIGS. 1 and 4–5, the longer channel length structure 18c comprises third and fourth N+ conductivity type regions 42 and 44, corresponding to the emitter and collector regions respectively, extending a distance into the substrate 12 from the surface 30 and spaced apart from one another. The insulator layer 32 overlies the surface 30 except over the spacing between the third and fourth N+ conductivity type regions 42 and 44. A field oxide region 46 is located between regions 42 and 44. The typical "bird's beak" 47, formed at either end of the field oxide 46, is typically about 0.5 micrometers in length. In a 1.25 micrometer design-rule fabrication process, the spacing between the third and fourth N+ conductivity type regions 42 and 44 is typically between about two and three micrometers. A third electrical contact 48 extends through an opening 50 in the thin insulator layer 32 to provide electrical contact to the third N+ conductivity type region 42. The third electrical contact 48 extends to the reference line 22. A fourth electrical contact 52 extends through an opening 54 in the thin insulator layer 32 to provide electrical contact to the fourth N+ conductivity type region 44. The fourth electrical contact 52 extends to the bus 20. An N− region 56 extends a distance into the substrate 12 from the surface 30 and from the fourth N+ conductivity type region 44. The function of the N− region 56 is to prevent metallic diffusion from the fourth electrical contact 52 into the substrate 12. A P+ region 58 extends a distance into the substrate 12 from the surface 30 a distance from the third N+ conductivity type region 42 and provides good electrical contact between the substrate 12 and the substrate contact 24.

The P− type conductivity substrate 12 is typically relatively lightly doped (about $10^{13}$/cc) and has a relatively low degree of conductivity. The N+ conductivity type regions are relatively heavily doped, typically about $10^{18}$/cc and have relatively high conductivity. The N− region 56 is relatively lightly doped, typically between about $10^{14}$/cc and $10^{15}$/cc and has a relatively low degree of conductivity. The P+ region 58 is relatively heavily doped and of relatively high conductivity. The electrical contacts, the bus and the reference line are typically composed of aluminum, molybdenum, other compatable metals, a silicide of or polysilicon or a combination of these materials.

Only one longer channel length structure is required for the operation of the invention but a plurality is preferred. The plurality of longer channel length structures, such as the four structures illustrated in FIG. 1, is typically positioned in proximity, and preferably positioned as close as permitted by the design rules for the fabrication process, to the short channel length structure 16.

The protection device of the invention is designed to breakdown and conduct at a voltage less than that which would cause damage to the integrated circuit and higher than the supply voltage of the integrated circuit. The protective device is designed to provide as closely as possible a short circuit between the bus 20 and the reference line 22 during the occurrence of a transient. In a typical application, the breakdown voltage for the short channel length structure 16 is about 8 volts and the breakdown voltage level for the longer channel length structure 18 is about 12 volts as compared to an integrated circuit supply voltage of about 5.5 volts. Accordingly, the protection device will not trigger at normal supply voltage levels. However, if a transient voltage occurs, the short channel length structure 16 will break down when the transient voltage exceeds 8 volts, causing base current to flow through the substrate 12. This current flow produces a voltage between the substrate 12 and the N+ region 42, leading to conduction and breakdown of the longer channel length structure 18 before the level of the transient voltage exceeds the damage threshold of the short channel length structure 16 and the circuit being protected. The longer channel length structure 18 typically turns on in about 1.0 to 1.5 nanoseconds after the the short channel length structure 16 begins to conduct.

During testing of engineering prototypes embodying the invention as shown in FIG. 1, it was discovered that current distribution at the ends of the protection structure was excessive. To insure that the distribution of current through the structure is such as to provide for an even distribution of current flow in all of the longer channel length structures 18, the N+ diffusion was increased for those longer channel length structures 18 farthest removed from the short channel length structure 16 to provide for resistive ballasting.

Figure 6:
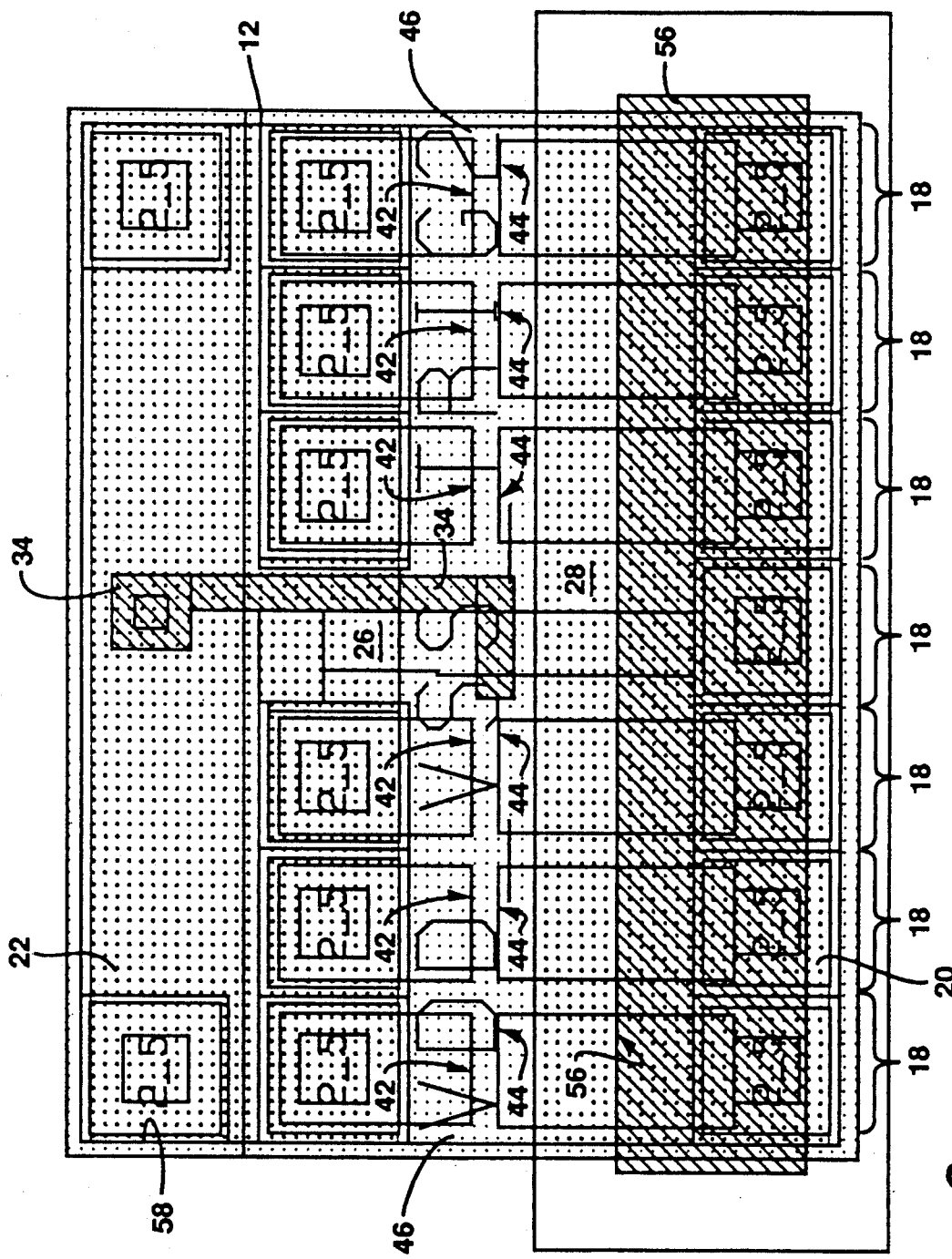
FIG. 6 is a plan top view of the layout of the structure for one embodiment of invention.

A top view of the layout of the structure of the invention as illustrated in FIGS. 1–5 is shown in FIG. 6 where the identifying numbers are the same as those of FIGS. 1–5. As shown, six longer channel length structures 18 are connected in parallel, about a centrally located short channel length structure 16.

Figure 7:
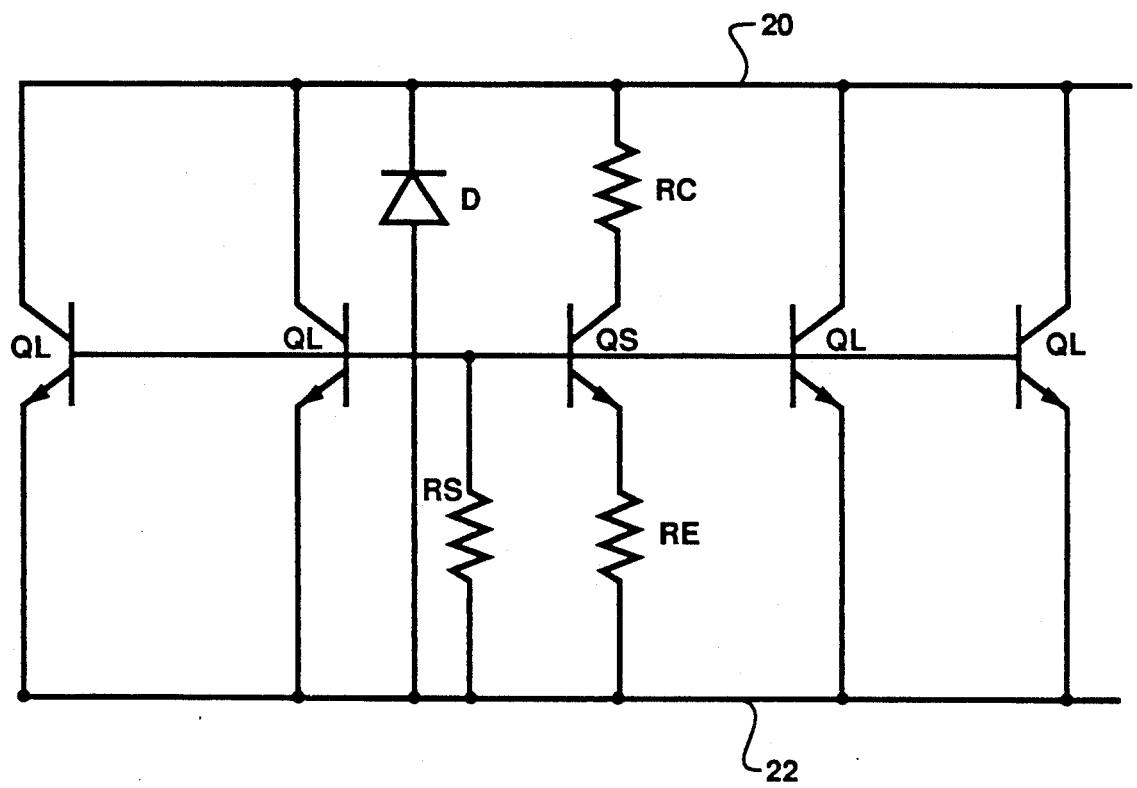
FIG. 7 is a circuit schematic diagram showing the effective equivalent circuit for the protection device of FIGS. 1-5.

In FIG. 7, the effective equivalent circuit of the protection device of FIGS. 1–5 includes a parasitic NPN transistor QS provided by the short channel length structure 16 and a plurality of parasitic NPN transistors QL provided by the plurality of longer channel length structures 18. The collector and emitter resistors RC and RE, respectively, are provided by the parasitic elements of the short channel length structure 16. The substrate resistance provides the emitter-base shunt resistance RS. The NPN transistor QS has its collector electrode connected to bus 20 through collector resistor RC and its emitter electrode connected to the reference line 22 through emitter resistor RE, and its base electrode connected in common with the base electrode of NPN transistor QL via the common substrate 12 and through emitter-base shunt resistance RS to the reference line 22.

The collector and emitter resistance RC and RE limit the current flow through NPN transistor QS thereby protecting the short channel length structure from high voltage transients. Once the parasitic NPN transistors QL are triggered into conduction by NPN transistors QS, the transistors QL will rapidly go into the snapback mode of conduction, thereby conducting away the transient energy. The critical current necessary for snap-back to occur in an NPN transistor QL is about five microamperes/micrometer. Accordingly, as soon as base current begins to flow in transistor QS, base current also flows in the parasitic NPN transistor QL. Due to the current limiting effect of resistors RC and RL, the majority of the current flows through QL, which snaps-back when the magnitude of current there-through exceeds the snap-back threshold for the structure.

A parasitic diode D, formed between the P+ region 58 and the N+ region 28 shown in FIG. 2 and between the P+ region 58 and the N+ region 44 shown in FIG. 5, permits the reverse flow of transient current from the reference line 22 to the bus 20.

The devices of the invention may be fabricated utilizing standard photolithographic and etching steps for definition and ion implantation for forming the doped regions. Typically, a silicon semiconductor substrate is used with, for example, boron as a P type dopant and phosphorus as an N type dopant, but other suitable materials may be used. The insulators are typically a silicon oxide or a nitride formed using techniques well known in the art.

Modifications of the various embodiments of the invention may occur to one skilled in the art. For example, while the invention has been described in terms of particular conductivity types, converse conductivity types may be used so long as the relative conductivity types remain the same. Such and like modifications are intended to be within the spirit and scope of the invention, and the appended claims.

I claim:

1. A protection device for an integrated circuit connected to a bus and a reference line comprising:
    a first bipolar transistor having emitter and collector regions spaced by a base region with a main current conduction path connected between the bus and the reference line; and
    one or more second bipolar transistors each having emitter and collector regions spaced by a base region with the emitter and collector regions being separate from the emitter and collector regions of the first bipolar transistor and with a main current conduction path connected between the bus and the reference line and positioned in proximity to the first bipolar transistor;
    wherein the first bipolar transistor has a breakdown voltage which is greater than a supply voltage for the integrated circuit and less than the breakdown voltage of the second bipolar transistor and the damage threshold of the integrated circuit;
    wherein the first bipolar transistor provides a main current conduction path between the bus and the reference line, the main current conduction path having a relatively lower impedance than that of the integrated circuit when the first bipolar transistor is in a conduction state; and
    wherein current flow in the first bipolar transistor triggers the second bipolar transistor into conduction thereby substantially reducing the impedance of the second bipolar transistor's main current conduction path to below that of the first bipolar transistor's main current path.

2. The device of claim 1 wherein the first bipolar transistor comprises:
    a substrate comprising a semiconductor material of a first conductivity type and having a surface;
    a first region of a second conductivity type, opposite that of the first conductivity type, adjacent the surface; and
    a second region of second conductivity type adjacent the surface and separated from the first region.

3. The device of claim 2 wherein a thin insulator layer overlying the surface over and between the first and second regions.

4. The device of claim 3 wherein a gate electrode overlies the thin insulator layer over the spacing between the first and second regions.

5. The device of claim 2 wherein the second bipolar transistor comprises:
    a third region of a second conductivity type, opposite that of the first conductivity type, adjacent the surface;
    a fourth region of second conductivity type adjacent the surface and separated from the third region; and
    a field oxide region thicker than the insulator layer overlying the surface between the third and fourth regions.

6. The device of claim 5 wherein said field oxide region has each of its ends partially juxtaposed to a portion of the third and fourth regions, respectively, and physically separates and electrically isolates the third and fourth regions from one another.

7. The device of claim 1 wherein:
    the first bipolar transistor comprises:
    a substrate comprising a semiconductor material of a first conductivity type and having a surface;
    a first region of a second conductivity type, opposite tat of the first conductivity type, adjacent the surface; and
    a second region of second conductivity type adjacent the surface and separated from the first region; and
    the second bipolar transistor comprises:
    a third region of a second conductivity type, opposite that of the first conductivity type, adjacent the surface;
    a fourth region of second conductivity type adjacent the surface and separated from the third region; and
    a field oxide region overlying the surface between the third and fourth regions.

8. The device of claim 7 wherein a thin insulator layer overlying the surface over and between the first and second regions.

9. The device of claim 7 wherein said field oxide region has each of its ends partially juxtaposed to a portion of the third and fourth regions, respectively, and physically separates and electrically isolates the third and fourth regions from one another.

10. A protection device for an integrated circuit connected to a bus and a reference line comprising:
    a first bipolar transistor having a main current conduction path connected between the bus and the reference line; and
    one or more second bipolar transistors, each having a main current conduction path connected between the bus and the reference line and positioned in proximity to the first bipolar transistor;
    the protection device including a substrate comprising a semiconductor material of a first conductivity type and having a surface;
    the first bipolar transistor comprising:
    a first region of a second conductivity type opposite that of the first conductivity type, adjacent the surface; and
    a second region of second conductivity type adjacent the surface and separated from the first region; and
    each second bipolar transistor comprising:
    a third region of a second conductivity type, opposite that of the first conductivity type, adjacent the surface and separate from the first and second regions;

a fourth region of second conductivity type adjacent the surface and separated from the third region and separate from the first and second regions; and a field oxide region overlying the surface between the third and fourth regions;

the spacing between the first and second regions being shorter than the spacing between the third and fourth regions.

11. The device of claim 10 further comprising a thin insulator layer overlying the surface over and between the first and second regions.

12. The device of claim 11 wherein a gate electrode overlies the thin insulator layer overt the spacing between the first and second regions.

13. The device of claim 10 wherein the first bipolar transistor includes a collector electrode connected to the bus, an emitter electrode connected to the reference line, and a base electrode, and each second bipolar transistor including a base electrode connected to the base electrode of the first bipolar transistor, a collector electrode connected to the bus, and an emitter electrode connected to the reference line.

14. The device of claim 13 further including a first resistor connected between the collector electrode of the first bipolar transistor and the bus, and a second resistor connected between he emitter electrode of the first bipolar transistor and the reference line.

15. The device of claim 14 further including a diode having a cathode electrode connected to the bus, and an anode electrode connected to the reference line, for providing a current conduction path between the reference line and the bus.

16. A protection device for an integrated circuit, comprising:

a first NPN bipolar transistor having a collector electrode connected by a first resistor to a bus, an emitter electrode connected by a second resistor to a reference line, and a base electrode, wherein the breakdown voltage of the first NPN bipolar transistor is greater than a supply voltage for the integrated circuit, and less than the insulator damage threshold thereof; and one or more second NPN bipolar transistors each having a collector electrode connected to the bus, an emitter electrode connected to the reference line, and a base electrode connected to the base electrode of the first NPN bipolar transistor, the collector and emitter electrodes of each of the second NPN bipolar transistors being separate from the collector and emitter electrodes of the first NPN bipolar transistor;

the emitter to collector spacing of the first NPN bipolar transistor being shorter than that of the second NPN bipolar transistor.

17. The device of claim 16 wherein:

the protection device includes a substrate comprising a semiconductor material of a first conductivity type and having a surface;

the first bipolar transistor comprising:

a first region of a second conductivity type, opposite that of the first conductivity type, adjacent the surface; and a second region of second conductivity type adjacent the surface and separated from the first region;

each second bipolar transistor comprising:

a third region of a second conductivity type. opposite that of the first conductivity type, adjacent the surface;

a fourth region of second conductivity type adjacent the surface and separated from the third region; and a field oxide region overlying the surface between the third and fourth regions;

the spacing between the first and second regions being smaller than the spacing between the third and fourth regions.

18. A protection device for an integrated circuit comprising:

a first bipolar transistor having a collector electrode connected to a bus, an emitter electrode connected to a reference line, and a bas electrode, and one or more second bipolar transistors, each having a base electrode connected to the base electrode of the first bipolar transistor, a collector electrode separate from the collector electrode of the first bipolar transistor and connected to the bus, and an emitter electrode separate from the emitter electrode of the first bipolar transistor and connected to the reference line;

wherein the first bipolar transistor has an emitter to collector spacing smaller than that of each second bipolar transistor and is positioned in proximity to a second bipolar transistor, and the protection device includes a substrate comprising a semiconductor material of a first conductivity type and having a surface; and the first bipolar transistor comprises:

a first region of a second conductivity type, opposite that of the first conductivity type, adjacent the. surface;

a second of second conductivity type adjacent the surface and separated from the first region; and each bipolar transistor comprises:

a third region of a second conductivity type. opposite that of the first conductivity type, adjacent the surface;

a fourth region of second conductivity type adjacent the surface and separated from the third region; and a field oxide region overlying the surface between the third and fourth regions;

the spacing between the first and second regions being smaller than the spacing between the third and fourth regions; and wherein the integrated circuit has a first terminal connected to the bus and a second terminal connected to the reference line.

19. The device of claim 18 further comprising a thin insulator layer overlying the surface over and between the first and second regions.

20. The device of claim 19 wherein a gate electrode overlies the thin insulator layer over the spacing between the first and second regions.

21. The device of claim 18 further including one or more resistors in the main current conduction pathe of the first bipolar transistor.

22. The device of claim 21 further including a diode having a cathode electrode connected to the bus, and an anode electrode connected to the reference line, for providing a current condition path between the reference line and the bus.

* * * * *